United States Patent

Shibuya et al.

[11] Patent Number: 5,431,733
[45] Date of Patent: Jul. 11, 1995

[54] LOW VAPOR-PRESSURE MATERIAL FEEDING APPARATUS

[75] Inventors: Munehiro Shibuya; Masatoshi Kitagawa; Takeshi Kamada; Takashi Hirao, all of Osaka, Japan

[73] Assignee: Matsushita Electric Industrial Co., Ltd., Osaka, Japan

[21] Appl. No.: 83,300

[22] Filed: Jun. 29, 1993

[30] Foreign Application Priority Data

Jun. 29, 1992 [JP] Japan .................. 4-170510

[51] Int. Cl.6 .............................. C23C 16/00
[52] U.S. Cl. ................................. 118/715
[58] Field of Search ............. 427/255.2, 255.1, 255.3; 148/DIG. 110, DIG. 65; 437/81; 118/715, 725

[56] References Cited

U.S. PATENT DOCUMENTS

| | | | |
|---|---|---|---|
| 3,508,962 | 4/1970 | Manasevit et al. | 437/81 |
| 4,388,342 | 6/1983 | Suzuki et al. | 437/81 |
| 4,419,381 | 12/1983 | Yamazaki | 427/255.2 |
| 4,436,674 | 3/1984 | McMenamin | 261/64 |
| 4,436,770 | 3/1984 | Nishizawa et al. | 427/255.3 |
| 4,576,836 | 3/1986 | Colmet et al. | 427/255.3 |
| 4,640,221 | 2/1987 | Barbee et al. | 118/715 |
| 4,668,530 | 5/1987 | Reif et al. | 427/255.2 |
| 4,761,269 | 8/1988 | Conger et al. | 118/715 |
| 5,069,930 | 12/1991 | Hussia et al. | 118/715 |
| 5,080,928 | 1/1992 | Klinedinst et al. | 427/255.2 |
| 5,190,913 | 3/1993 | Higashiqama et al. | 505/1 |
| 5,203,925 | 4/1993 | Shibuya et al. | 118/725 |
| 5,336,356 | 8/1994 | Ban et al. | 156/345 |

FOREIGN PATENT DOCUMENTS 222472 1/1990 Japan .

OTHER PUBLICATIONS

Silicon Processing for the VLSI Era, Stanley Wolf and Richard N. Tauber, vol. 1, pp. 164–166, (1986).

Primary Examiner—Olik Chaudhuri
Assistant Examiner—Brian K. Dutton
Attorney, Agent, or Firm—Pollock, Vande Sande & Priddy

[57] ABSTRACT

A low vapor-pressure material feeding apparatus comprises a bubbler (4, 5), accommodating a low vapor-pressure material (6) therein, for bubbling the low vapor-pressure material (6) with an inert gas fed from an inert gas container (3). A bifurcated gas feeding passage (51, 8) is provided between the gas container (3) and a vacuum chamber (50). One branch passage directly introduces an inert gas into the vacuum chamber (50), and the other branch passage introduces an inert gas into the bubbler (4, 5). A gas mixture of a vaporized low vapor-pressure material (6) and the inert gas, is supplied from the bubbler (4, 5) to a vacuum chamber (50). A gas flow meter (7) detects a flow amount of the gas mixture. On a basis of a gas flow amount detected by the gas flow meter (7), an inert gas controller (10) adjusts a feeding amount of inert gas so that a total amount of an inert gas introduced directly into said vacuum chamber (50) and an inert gas introduced into the bubbler (4, 5) is kept at a constant value.

12 Claims, 2 Drawing Sheets

LOW VAPOR-PRESSURE MATERIAL FEEDING APPARATUS

BACKGROUND OF THE INVENTION

1. Field of the Invention

The present invention relates to a novel apparatus for feeding a low vapor-pressure, liquid or solid, material into a reaction furnace for use in a CVD (Chemical Vapor Deposition) method, in which thin solid films grow on a crystalline substrate as the result of thermochemical vapor-phase reactions.

2. Description of the Prior Art

In the CVD method, in order to form thin solid films on a crystalline substrate, a growth material such as Si organic substance, tetrachlorosilane, and ethyl silicate, is deposited on the surface of the substrate in a form of oxide as a result of heat decomposition in an environment of 600°-800° C.

FIG. 4 shows one apparatus having been conventionally used in the CVD method, in which a low vapor-pressure liquid material is vaporized. In FIG. 4, the low vapor-pressure material 20 is accommodated in an ampoule 11. The ampoule 11 is surrounded by a thermostatic tank 12, in which the low vapor-pressure material 20 can be heated up to a certain temperature at which the low vapor-pressure material 20 vaporizes easily. Inert gas 13 is fed into the ampoule 11 through a flow control unit 14. This flow control unit 14 controls a flow amount of the inert gas 13 supplied therethrough. The inert gas 13 introduced into the ampoule 11 bubbles the low vapor-pressure material 20 having been heated by the thermostatic tank 12. Thus, vaporized low vapor-pressure material 20 and inert gas 13 are conveyed together into a vacuum chamber 17 through a gas feeding pipe 16. This gas feeding pipe 16 is heated, by a surrounding heater 15, up to a temperature higher than that of the thermostatic tank 12.

However, such a conventional apparatus has a disadvantage in controlling an amount of the low vapor-pressure material 20 to be vaporized. Namely, in order to stabilize the supply amount of the vaporized low vapor-pressure material 20, this conventional apparatus forces us to precisely control the temperature and pressure of the ampoule 11. Controlling both the temperature and pressure of the ampoule 11 precisely is not so easy.

Another disadvantage of this conventional apparatus will reside in its structural deficiency because this conventional apparatus is incapable of directly controlling the flow amount of the vaporized low vapor-pressure material. This disadvantage will become more apparent in such a case that the apparatus configuration is changed or modified for some reasons. For example, if sizes of the respective apparatus component are changed, the low vapor-pressure material will correspondingly cause a change in its flow amount. This change results in an error in the control of feeding amount of the low vapor-pressure material.

In order to solve this problem, it is desirable to use a flow control device capable of precisely controlling the flow amount of the low vapor-pressure material. Endurance temperatures of present days flow control devices are, however, limited within a relatively low temperature zone of approximately 150° C. Hence, no flow control device could control a low vapor-pressure material, if a vapor pressure was not sufficiently obtained for the flow control in an environment below 150° C.

As is explained in the foregoing description, the conventional apparatus could not stably control a feeding amount of a low vapor-pressure material in the CVD method because no control means directly controlling the feeding amount of the low vapor-pressure material was available in the past.

SUMMARY OF THE INVENTION

Accordingly, the present invention has a purpose, in view of the above-described problems or disadvantages encountered in the prior art, to provide an improved low vapor-pressure material feeding apparatus capable of precisely controlling the flow amount of the vaporized low vapor-pressure material.

In order to accomplish the above purpose, the present invention provides a low vapor-pressure material feeding apparatus comprising: bubbler means accommodating a low vapor-pressure material therein for bubbling the low vapor-pressure material with an inert gas so as to vaporize the low vapor-pressure material; inert gas supply means for feeding the inert gas into the bubbler means; gas mixture feeding means for feeding a gas mixture of a vaporized low vapor-pressure material and the inert gas from said bubbler means to a vacuum chamber; gas flow amount detecting means for measuring a flow amount of the gas mixture; and inert gas control means for adjusting a feeding amount of the inert gas on the basis of a detecting signal of said gas flow amount detecting means.

In a low vapor-pressure material feeding apparatus described above, it is preferable that the gas flow amount detecting means operates in an environment more than 150° C.

Furthermore, the inert gas supply means preferably includes a bifurcated feeding passage. One of the branch passages of this bifurcated feeding passage bypasses the bubbler means and communicates directly with the vacuum chamber.

Still further, the inert gas control means is provided in each of said branch passages of the bifurcated feeding passage. The inert gas control means, provided in the branch passage communicating with the bubbler means, controls a gas feeding amount supplied to the vacuum chamber so that a constant amount of vaporized low vapor-pressure material can be supplied to the vacuum chamber. On the other hand, the inert gas control means, provided in the branch passage bypassing the bubbler means, controls a gas feeding amount supplied to the vacuum chamber so that a total amount of both an inert gas introduced directly into the vacuum chamber and an inert gas introduced into the bubbler means is kept at a constant value.

The above and other objects, features and advantages of the present invention will become more apparent from the following detailed description which is to be read in conjunction with the accompanying drawings.

DETAILED DESCRIPTION OF THE PREFERRED EMBODIMENTS

Hereinafter, with reference to accompanying drawings, preferred embodiments of the present invention are explained in detail.

Figure 1:
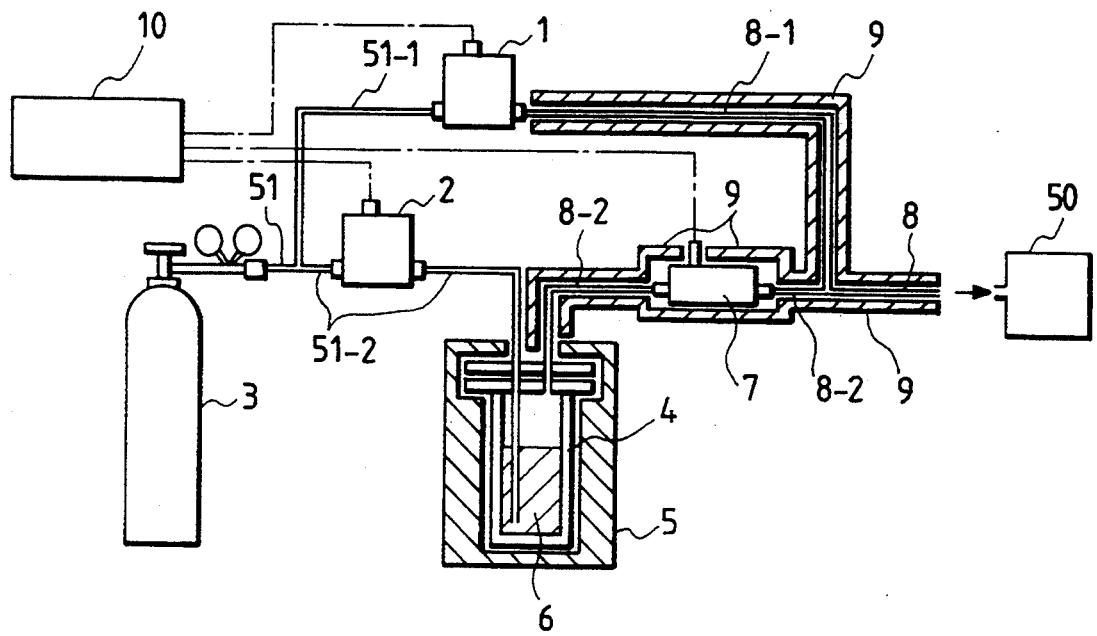
FIG. 1 is a block diagram schematically showing one embodiment of a low vapor-pressure material feeding apparatus embodying the present invention, in which a liquid material is used as a low vapor-pressure material.

In FIG. 1, a reference numeral 3 represents an inert gas container, which includes an inert gas. There is provided an upstream gas feeding pipe 51, whose downstream passage is bifurcated into a first upstream branch passage 51-1 and a second upstream branch passage 51-2. The first upstream branch passage 51-1 connects the inert gas container 3 with a first gas flow control unit 1. The second upstream branch passage 51-2 connects the inert gas container 3 with an ampoule 4 accommodated in a thermostatic tank 5 via a second gas flow control unit 2.

There is also provided a downstream gas feeding pipe 8, whose upstream passage is bifurcated into a first downstream branch passage 8-1 and a second downstream branch passage 8-2. The first downstream branch passage 8-1 connects the first gas flow control unit i with a vacuum chamber 50. This vacuum chamber 50 serves as a reaction furnace for growing thin solid films on a crystalline substrate as a result of thermochemical vapor-phase reactions. The second downstream branch passage 8-2 connects the ampoule 4 accommodated in the thermostatic tank 5 with the vacuum chamber 50 via a mass flow meter 7.

The mass flow meter 7 serves as a gas flow amount detector, and is capable of operating an environment more than 150° C.

A first gas flow control unit 1 controls a flow amount of inert gas supplied therethrough. Namely, the first gas flow control unit 1 adjusts the inert gas flow amount introduced directly from the inert gas container 3 to the vacuum chamber 50.

A second gas flow control unit 2 controls a flow amount of inert gas supplied therethrough. Namely, the second gas flow control unit 2 adjusts the inert gas flow amount introduced from the inert gas container 3 to the ampoule 4 surrounded by the thermostatic tank 5. The inert gas, introduced into the ampoule 4, bubbles a liquid material 6. The thermostatic tank 5 adds heat to the ampoule 4 so as to keep the temperature of the liquid material 6 at an adequate temperature. The ampoule 4 and the thermostatic tank 5 constitute a bubbler.

This bubbling action generates a gas mixture of a vaporized liquid material 6 and an inert gas, which is, in turn, fed into the mass flow meter 7. After passing through this mass flow meter 7, the gas mixture is further mixed with inert gas controlled by the first gas flow control unit 1 and thereafter fed into the vacuum chamber 50.

The mass flow meter 7 and the downstream branch passages 8-1, 8-2 are surrounded by a heater 9, which keeps the temperature of the mass flow meter 7 and the downstream branch passages 8-1, 8-2 at a value equal to or more than that of the thermostatic tank 5.

In this embodiment, Ar is used as an inert gas. Also, $Ta(OC_2H_5)_5$ is used as the liquid material 6, i.e. as the low vapor-pressure material.

Hereinafter, a procedure for obtaining control amounts in accordance with this invention will be explained. For calculations, various factors are defined as follows. A conversion factor of Ar is $C_{fA}$, and a conversion factor of $Ta(OC_2H_5)_5$ is $C_{fT}$. A flow amount of Ar is $L_0$, and a density of $Ta(OC_2H_5)_5$ contained in Ar gas is $t\%$. A value detected by the mass flow meter 7 is $L_M$.

With these factors, a conversion factor $C_{f0}$ of the gas mixture is expressed by the following equation (1) under the condition that the mass flow meter 7 is corrected its flow amount in terms of Ar.

$$C_{f0} = \frac{L_M}{C_{fA}} \left( \frac{C_{fA}(100 - t) + C_{fT} \cdot t}{100} \right) \tag{1}$$

An actual flow amount $F_0$ of the gas mixture is expressed by the following equation (2).

$$F_0 = \frac{L_M}{C_{fA}} \left( \frac{C_{fA}(100 - t) + C_{fT} \cdot t}{100} \right) \tag{2}$$

Further assuming that a flow amount controlled by the second gas flow control unit 2 is $L_0$, a flow amount $L_T$ of $Ta(OC_2H_5)_5$ is expressed by the following equation (3).

$$L_T = \frac{L_M}{C_{fA}} \left( \frac{C_{fA}(100 - t) + C_{fT} \cdot t}{100} \right) - L_0 \tag{3}$$

If the density of $Ta(OC_2H_5)_5$ is increased from t to $(t+\Delta t)$, a flow amount $L_T'$ of $Ta(OC_2H_5)_5$ being changed in response to this density increase of $Ta(OC_2H_5)_5$ is expressed by the following equation (4).

$$\begin{aligned}
L_{T'} &= \frac{t + \Delta t}{t} \cdot L_T(t) \\
&= L_T(t + \Delta t) \\
&= \frac{L_M'}{C_{fA}} \left( \frac{C_{fA}(100 - t - \Delta t) + C_{fT}(t + \Delta t)}{100} \right)
\end{aligned} \tag{4}$$

Wherein, $L_M'$ represents a value detected by the mass flow meter 7 when the density t is changed to $t+\Delta t$. If the equation (4) is rewritten for $L_M'$, it is changed as follows.

$$L_M' = \frac{L_M \left( \frac{t + \Delta t}{t} \right) \left( \frac{C_{fA}(100 - t) + C_{fT} \cdot t}{100} \right) - \frac{L_0 \Delta t}{t}}{\frac{C_{fA}(100 - t - \Delta t) + C_{fT}(t + \Delta t)}{100}} \tag{5}$$

Accordingly, the flow amount $L_T'$ of $Ta(OC_2H_5)_5$ is expressed in the following equation (6).

$$L_{T'} = \frac{L_M'}{C_{fA}} \left( \frac{C_{fA}(100 - t - \Delta t) + C_{fT}(t + \Delta t)}{100} \right) - L_0 \tag{6}$$

The flow amount of Ar is considered to be proportional to that of the $Ta(OC_2H_5)_5$. Accordingly a flow amount $L_0'$ of Ar, required for returning $L_T'$ to an original value $L_T$, is obtained in the following equation (7).

$$L_0' = L_0 - \frac{L_T}{L_T'} \quad (7)$$

Hence, an actual flow amount $F_0'$ of the gas mixture passing through the mass flow meter 7 is expressed in the following equation (8).

$$F_0' = L_0' + L_T \quad (8)$$
$$= \frac{L_M''}{C_{fA}} \left( \frac{C_{fA}(100 - t - \Delta t) + C_{fT}(t + \Delta t)}{100} \right)$$

The indication value $L_M''$ in this instance is expressed in the following equation (9).

$$L_M'' = \frac{C_{fA}(L_0' + L_T)}{\frac{C_{fA}(100 - t - \Delta t) + C_{fT}(t + \Delta t)}{100}} \quad (9)$$

If an initial amount of Ar passing through the gas flow control unit is $L_R$, a flow amount $L_R'$ canceling a change between $L_0$ and $L_0'$ is obtained in the following equation (10).

$$L_{r'} = L_R - (L_0' - L_0) \quad (10)$$

Accordingly, a total flow amount $L_{Ar}$ of Ar is expressed in the following equation (11).

$$L_{Ar} = L_{R'} + L_0' \quad (11)$$
$$= L_R + L_0$$

According to above equations, a flow amount calculator 10 controls the first and second gas flow control units 1 and 2 in response to a detection signal fed from the mass flow meter 7. Therefore, a total flow amount of both Ar and Ta(OC$_2$H$_5$)$_5$ can be kept at a constant value even if the concentration of Ta(OC$_2$H$_5$)$_5$ is varied.

That is to say, the inert gas, controlled its flow amount by the gas flow amount control unit 2, is introduced into the ampoule 4. In the ampoule 4, the introduced inert gas bubbles the low vapor-pressure material 6 accommodated therein. With this bubbling action, a gas mixture of the vaporized low vapor-pressure material 6 and the inert gas is generated. The generated gas mix is then fed into the mass flow meter 7. The mass flow meter 7 detects a change of the concentration of the low vapor-pressure material 6. On the basis of this change of the concentration of the low vapor-pressure material 6, the flow amount calculator 10 causes the second gas flow amount control unit 2 to vary the flow amount so as to compensate this change. Thus, the amount of vaporized low vapor-pressure material 6 to be supplied to the vacuum chamber 50 can be kept at a constant value.

Furthermore, the change of the inert gas amount caused by the second gas flow amount control unit 2 is compensated by the first gas flow amount control unit 1. Accordingly, a total amount of the inert gas to be supplied to the vacuum chamber 50 can be kept at a constant value.

The conversion factor $C_{f0}$ of the gas mixture was expressed by the equation (1) in the foregoing description, however, it will be more precisely expressed by the following equation (12), assuming that various properties of the gas mixture, gas 1, and gas 2 are defined as follows. The gas mixture, gas 1, and gas 2 have densities of $P_0$, $P_1$, and $P_2$, respectively. The gas mixture, gas 1, and gas 2 have specific heats of $M_0$, $M_1$, and $M_2$, respectively. The gas 1 and gas 2 have concentrations of t% and (100-t)%, respectively. And, the gas mixture, the gas 1, and gas 2 have coefficients relating to heat conductivity and viscosity of $N_0$, $N_1$, and $N_2$, respectively.

$$C_{f0} = \frac{0.3098}{p_0 \times M_0} \times N_0 \quad (12)$$

Wherein, $P_0$, $M_0$, and $N_0$ are expressed by the following equations (13) to (15).

$$p_0 = \frac{t}{100} p_1 + \frac{(100 - t)}{100} p_2 \quad (13)$$

$$M_0 = \frac{p_1}{p_0} M_1 + \frac{p_2}{p_0} M_2 \quad (14)$$

$$N_0 = \frac{t}{100} N_1 + \frac{(100 - t)}{100} N_2 \quad (15)$$

Figure 2:
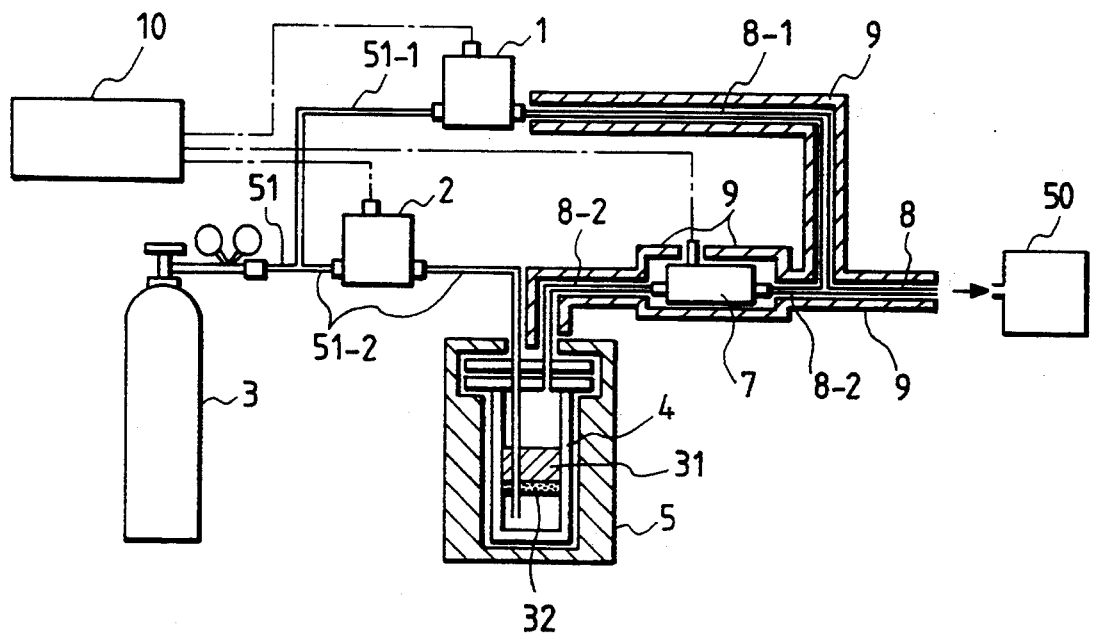
FIG. 2 is a block diagram schematically showing another embodiment of a low vapor-pressure material feeding apparatus embodying the present invention, in which a solid material is used as a low vapor-pressure material.

Although a liquid material is used as a low vapor-pressure material in this embodiment, the similar effect will be obtained even if a solid material is used as shown in FIG. 2.

In FIG. 2, a solid material 31 is placed in the ampoule 4 as the low vapor-pressure material, it is preferable to provide a mesh 32 in the ampoule 4. In this case, the solid material 31 is mounted on this mesh 32. And, the inert gas is introduced into a space under the mesh 32, as shown in FIG. 2.

Figure 3:
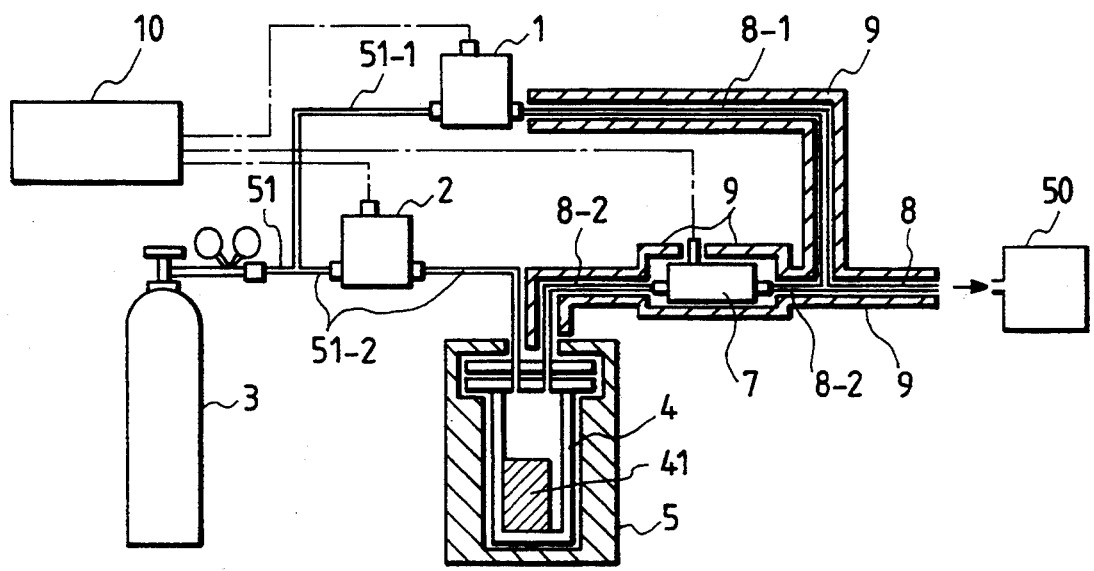
FIG. 3 is a block diagram schematically showing still another embodiment of a low vapor-pressure material feeding apparatus embodying the present invention, in which a powder material is used as a low vapor-pressure material.
Figure 4:
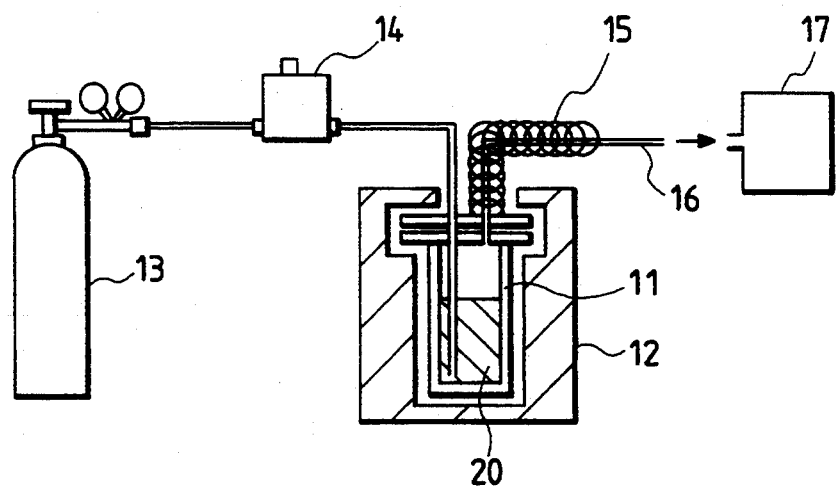
FIG. 4 is a block diagram schematically showing a conventional low vapor-pressure material feeding apparatus.

Furthermore, in case that a powder material 41 is used as the low vapor-pressure material as shown in FIG. 3, it is preferable to accommodate this powder material 41 in the ampoule 4 remote from the gas feeding pipe 51 so as not being directly exposed to a blow of the inert gas as shown in FIG. 3. With this arrangement, it becomes possible to prevent the original configuration of the powder material 41 from being changed during low vapor-pressure material feeding control.

Besides Ar, another gas such as He and N$_2$ can be used as an inert gas.

As explained in the foregoing description, in accordance with the present invention, the flow amount of the gas mixture is detected by the gas flow amount detector. Based on a signal detected by the gas flow amount detector, a gas flow control unit adjusts a flow amount of an inert gas so that the flow amount of a vaporized low vapor-pressure material can be kept to be a predetermined value. In other words, the present invention allows us to directly monitor the flow amount of the vaporized flow vapor-pressure material and adjust the flow amount of the inert gas, thereby realizing precise control of the flow amount of the vaporized low vapor-pressure material and the inert gas to be supplied to the vacuum chamber.

As a result, not only the feeding control of the vaporized low vapor-pressure material is stabilized but no complicated temperature control is required. Because the feeding amount of the low vapor-pressure material is hardly changed even if the concentration of the low vapor-pressure material is changed due to changes of temperature and pressure.

As this invention may be embodied in several forms without departing from the spirit of essential characteristics thereof, the present embodiments are therefore illustrative and not restrictive, since the scope of the invention is defined by the appending claims rather than by the description preceding them, and all changes that fall within the metes and bounds of the claims, or equivalence of such metes and bounds are therefore intended to be embraced by the claims.

What is claimed is:

1. A low vapor-pressure material feeding apparatus comprising:
    bubbler means, accommodating a low vapor-pressure material therein, for bubbling the low vapor-pressure material with an inert gas so as to generate a gas mixture of vaporized low vapor-pressure material and the inert gas;
    inert gas supply means, provided upstream of said bubbler means, for feeding the inert gas into said bubbler means;
    gas mixture feeding means, provided downstream of said bubbler means, for feeding the gas mixture of the vaporized low vapor-pressure material and the inert gas from said bubbler means to a vacuum chamber;
    gas flow control means, provided in said inert gas supply means, for adjusting a flow amount of the inert gas passing therethrough, said gas flow control means being not provided in said gas mixture feeding means;
    gas flow amount detecting means, provided in said gas mixture feeding means, for measuring a flow amount of said gas mixture;
    control means for adjusting a feeding amount of said inert gas by controlling said gas flow control means on the basis of a detecting signal of said gas flow amount detecting means.

2. A low vapor-pressure material feeding apparatus in accordance with claim 1, wherein said inert gas supply means includes a bifurcated feeding passage, having one branch passage which bypasses said bubbler means and communicates directly with said vacuum chamber, and another branch passage which communicates directly with said bubbler means.

3. A low vapor-pressure material feeding apparatus in accordance with claim 2, wherein said gas flow control means is provided in each of said branch passages of said bifurcated feeding passage.

4. A low vapor-pressure material feeding apparatus in accordance with claim 2, wherein said gas flow control means, provided in the branch passage communicating with said bubbler means, controls a gas feeding amount supplied to said vacuum chamber so that a constant amount of vaporized low vapor-pressure material can be supplied to the vacuum chamber.

5. A low vapor-pressure material feeding apparatus in accordance with claim 2, wherein said gas flow control means, provided in the branch passage bypassing said bubbler means, controls an inert gas feeding amount supplied to said vacuum chamber so that a total amount of both an inert gas introduced directly into said vacuum chamber and an inert gas introduced into said bubbler means is kept at a constant value.

6. A low vapor-pressure material feeding apparatus in accordance with claim 1, wherein said bubbler means includes a heating means for adding heat to the low vapor-pressure material.

7. A low vapor-pressure material feeding apparatus comprising:
    bubbler means, accommodating a low vapor-pressure material therein, for bubbling the low vapor-pressure material with an inert gas so as to generate a gas mixture of vaporized low vapor-pressure material and the inert gas;
    inert gas supply means for feeding the inert gas into said bubbler means;
    gas mixture feeding means for feeding the gas mixture of the vaporized low vapor-pressure material and the inert gas from said bubbler means to a vacuum chamber;
    gas flow amount detecting means for measuring a flow amount of said gas mixture; and
    inert gas control means for adjusting a feeding amount of said inert gas on the basis of a detecting signal of said gas flow amount detecting means;
    wherein said gas flow amount detecting means operates in a temperature environment of more than 150° C.

8. A low vapor-pressure material feeding apparatus in accordance with claim 7, wherein said inert gas supply means includes a bifurcated feeding passage having one branch passage which bypasses said bubbler means and communicates directly with said vacuum chamber.

9. A low vapor-pressure material feeding apparatus in accordance with claim 8, wherein said inert gas control means is provided in each of said branch passages of said bifurcated feeding passage.

10. A low vapor-pressure material feeding apparatus in accordance with claim 9, wherein said inert gas control means, provided in the branch passage communicating with said bubbler means, controls a gas feeding amount supplied to said vacuum chamber so that a constant amount of vaporized low vapor-pressure material can be supplied to the vacuum chamber.

11. A low vapor-pressure material feeding apparatus in accordance with claim 9, wherein said inert gas control means, provided in the branch passage bypassing said bubbler means, controls an inert gas feeding amount supplied to said vacuum chamber so that a total amount of both an inert gas introduced directly into said vacuum chamber and an inert gas introduced into said bubbler means is kept at a constant value.

12. A low vapor-pressure material feeding apparatus in accordance with claim 7, wherein said bubbler means includes heating means for adding heat to the low vapor-pressure material.

* * * * *